United States Patent
Hinterscher

(10) Patent No.: US 6,509,764 B2
(45) Date of Patent: Jan. 21, 2003

(54) LOW COMPONENT CIRCUIT FOR REDUCING POWER DISSIPATION CAPACITANCE

(75) Inventor: Eugene B. Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/005,640

(22) Filed: Dec. 4, 2001

(65) Prior Publication Data

US 2002/0075044 A1 Jun. 20, 2002

Related U.S. Application Data

(60) Provisional application No. 60/256,898, filed on Dec. 19, 2000.

(51) Int. Cl.[7] .................................................. H03B 1/00
(52) U.S. Cl. ........................................ 327/108; 327/185
(58) Field of Search ................................ 327/108, 109, 327/112, 185, 189, 194, 320, 321, 326, 333, 502–504; 326/56–58, 81–85

(56) References Cited

U.S. PATENT DOCUMENTS

| | | | | |
|---|---|---|---|---|
| 5,146,159 A | * | 9/1992 | Lau et al. | 324/537 |
| 5,262,689 A | * | 11/1993 | Glica et al. | 327/108 |
| 6,313,672 B1 | * | 11/2001 | Ajit et al. | 326/27 |
| 6,353,333 B1 | * | 3/2002 | Curd et al. | 326/57 |

* cited by examiner

*Primary Examiner*—My-Trang Nu Ton
(74) *Attorney, Agent, or Firm*—W. Daniel Swayze, Jr.; W. James Brady; Frederick J. Telecky, Jr.

(57) ABSTRACT

An improved pre-driver circuit 33, which uses only three additional components to bypass the back-gate current blocking diodes for increased circuit speed during normal operation, while reducing the $I_{off}$ current and satisfying over-voltage tolerant specification. This unique circuit uses the pre-driver's tri-state input signal to control the pull-up path of the pre-driver circuit's upper output (UOP) transistor 3010.

10 Claims, 3 Drawing Sheets

LOW COMPONENT CIRCUIT FOR REDUCING POWER DISSIPATION CAPACITANCE

This application claims priority under 35 USC §119(e)(1) of provisional application Ser. No. 60/256,898, filed Dec. 19, 2000.

BACKGROUND OF THE INVENTION

1. Field of the Invention

The present invention relates to pre-driver circuits and particularly to turning off the upper output device in such circuits.

2. Description of Background Art

In many tri-state pre-driver circuits, back-gate current blocking diodes in the pull-up path connected to the gate of an upper output transistor may prevent the transistor from turning completely OFF, thereby increasing both the dynamic operating current ($I_{ccd}$) and the power dissipation capacitance ($C_{pd}$) of the device.

FIG. 1 is a schematic for a conventional pre-driver circuit 10 with In and Tri-state signal inputs and an input/output (I/O) pin. The circuit has blocking diodes 11 connected in the $V_{dd}$ line to the back-gate of the circuit's control transistors to prevent $I_{off}$ current from flowing into $V_{dd}$ when a $V_{dd}+v_t$ voltage is applied to the input/output (I/O) pin during the tri-state condition. The pre-driver circuit has a p-channel upper output (UOP) transistor 100 and a n-channel lower output (LOP) transistor 101 with the drains being connected together through a ballast resistor 102, and the sources being connected between $V_{dd}$ and Gnd, respectively. The circuit's input/output (I/O) pin is taken off the drain of the UOP transistor 100. The blocking diodes 11, shown as a pn diode 111 in parallel with a Schottky diode 110, are connected between $V_{dd}$ and the $V_{ddref}$ source line driving the transistor's back-gates.

During normal operation of the circuit, when both the In and Tri-state signals are LOW, p-channel transistor 103 turns ON, coupling the $V_{dd}$ signal through parallel blocking diodes 110 and 111 to the gate of the upper output transistor 100, thereby attempting to turn OFF output transistor 100. However, particularly in high frequency switching conditions, the voltage drop across these diodes can prevent the gate of the upper output transistor from pulling all the way up to the $V_{dd}$ rail and completely turning OFF, thereby allowing an increase in the circuit's dynamic operating current ($I_{ccd}$). This in turn effectively increases the devices power dissipation capacitance ($C_{pd}$).

The $I_{ccd}$ current is given as $$I_{ccd}=(C_{pd})*(V_{dd})*f_{in}+(i_{ccd\_static}),$$

where $f_{in}$=the input frequency in Hz.

In many pre-driver circuits, the back-gate blocking diodes are by-passed to increase circuit speed during normal operation of the pre-driver circuit, while reducing $I_{off}$ current and satisfying over-voltage tolerant specifications.

FIG. 2 is a schematic for a conventional circuit that by-passes the back-gate current blocking diodes. The circuit consists of a conventional pre-driver circuit 20 and a blocking diode bypass circuitry 21. The pre-driver circuit 20 has a p-channel UOP transistor 200 and a n-channel LOP transistor 201 with drains connected together through a ballast resistor 202 and an I/O pin connected to the drain of p-channel transistor 200.

In the blocking diode circuit 21, transistors 211 and 214 are used to short around parallel pn/Schottky diodes 210/219 and provide $V_{dd}$ directly to the back-gate source line $V_{ddref}$, while p-channel transistors 217, 218, and 212 serve as the critical $I_{off}$ and over-voltage tolerant circuit components. Under normal operation, transistors 212, 217, 218 are in an OFF condition and inverter 215 supplies a low voltage to the gate of p-channel transistor 211 through n-channel transistor 214, thus supplying $V_{dd}$ to $V_{ddref}$ line, bypassing the current blocking diodes 210/219. This provides a stable $V_{dd}$ source at the back-gate of UOP transistor 200 and the back-gate and sources of the UOP p-channel pre-driver transistors 203 and 204, instead of $V_{dd}$ minus the voltage drop across blocking diodes 210/219.

In this circuit, $I_{off}$ is the maximum leakage current into and out of the input/output transistors 200,201 when $V_{dd}$=0V and the I/O pin is forced to a given DC voltage. During the $I_{off}$ condition, n-channel transistor 216 is in an OFF condition, while p-channel transistors 217 and 218 are in an ON condition, shorting the I/O pin to S1 and S4 nodes, respectively. When the I/O pin is ramped to a given DC voltage, the voltage at node S1 through transistor 217 will assure that inverter 213 will pull node S2 to ground, thereby turning OFF n-channel transistor 214, releasing control of node S4 to the I/O pin through p-channel transistor 218. Notice that n-channel transistor 214 will never be in the ON condition during an $I_{off}$ condition since the $V_{dd}$ source voltage to inverter 213 is 0 volts for this condition. The DC voltage on the I/O, pin through transistor 218, also assures that p-channel transistor 211 is in the OFF condition. Therefore, the $V_{ddref}$ line will track the given DC voltage on the I/O pin since transistors 212, 218, and 203 are all in the ON condition, thereby controlling the signal to the gate and back-gate of UOP p-channel transistor 200. When the I/O node is ramped during an $I_{off}$ test, the ramped signal is fed through transistors 212 and 218 to the gate and back-gate of UOP transistor 200, assuring that the UOP transistor 200 remains in an OFF condition, thereby reducing the $I_{off}$ current through UOP transistor 200.

These type circuits also must protect against over-voltage applied to the I/O pin while in the tri-state mode, satisfying standard over-voltage tolerant specifications. When the voltage on the disabled I/O pin is pulled to a voltage $v_t$ above $V_{dd}$, p-channel transistor 217 is in an ON condition and connects signal S1 to the I/O voltage, assuring that n-channel transistor 214 is in an OFF condition, thus giving control of the signal S4 to the I/O through p-channel transistor 218. Also, the voltage on the I/O pin will assure that p-channel transistor 211 remains in an OFF condition, thus eliminating the risk of any current sinking into $V_{dd}$ through transistor 211. Also, in the tri-state mode, when an over-voltage (a voltage $v_t$ above $V_{dd}$) is applied to the disabled I/O pin, p-channel transistor 212 will be in an ON condition and the $V_{ddref}$ line will track the I/O pin voltage. Transistors 212 and 218 will supply the voltage on the I/O pin to back-gate of the UOP transistor 200, thus clamping the back-gate and drain of the UOP transistor. Also, transistors 212 and 218 supplies the voltage on the I/O pin to the back-gate and source of p-channel transistor 204, in the main pre-driver circuit, further assuring that the gate and drain of UOP transistor 200 does not turn ON and sink current into $V_{dd}$.

The conventional blocking diode by-pass and over-voltage tolerant circuit approach discussed above requires approximately as many components as the pre-driver circuit being improved. What is needed is an effective solution that requires a minimum number of additional components to by-pass the blocking diodes, reduce the $I_{off}$ current, and provide over-voltage tolerant protection. The embodiment of the present invention overcomes this need by providing these functions using only three additional components and, as a result is more efficient and more cost competitive to manufacture.

SUMMARY OF THE INVENTION

In its broader aspect, the present invention discloses a pre-driver circuit, which uses three additional components to (1) bypass the back-gate current blocking diodes, (2) lower the $I_{off}$ current, and (3) provide over-voltage tolerant protection in the pre-driver circuit. The circuit accomplishes these three characteristics by adding only three additional components, which is a 65% reduction in required circuitry over conventional approaches.

The solution disclosed in the present invention is unique because it uses the pre-driver's tri-state input signal to control the pull-up path of the pre-driver circuit. This circuit by-passes the blocking diode (or diodes) found in many pre-driver circuit's pull-up path, which is connected in the path to the gate of an upper output (UOP) transistor, preventing an increase in the power dissipation capacitance ($C_{pd}$) of the circuit. Particularly, in high frequency switching conditions, the removal of these diodes allows the gate of the UOP transistor to pull-up to the $V_{dd}$ rail and as a result, completely turn off the UOP transistor, thereby preventing an increase in the dynamic operating current ($I_{ccd}$) and the power dissipation capacitance ($C_{pd}$) of the device.

DESCRIPTION OF THE VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The preferred embodiment of a improved pre-driver circuit in accordance with the present invention incorporates three additional components to the circuit to by-pass the back-gate current blocking diodes for increase circuit speed during normal operation, while maintaining reduced $I_{off}$ current and satisfying over-voltage tolerant specifications in the tri-state mode of operation.

Figure 1:
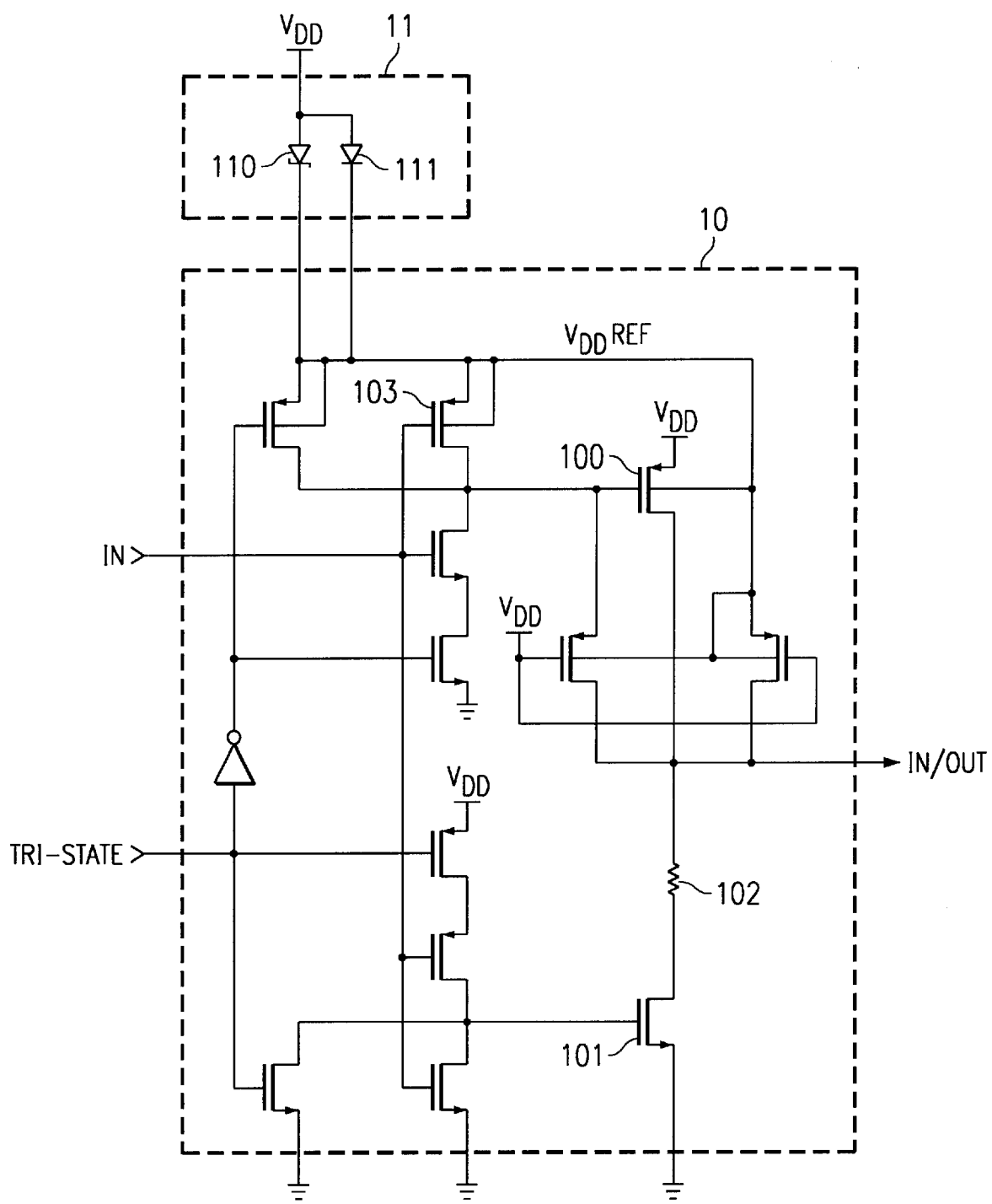
FIG. 1 is a schematic of a typical pre-driver circuit with current blocking diodes between $V_{dd}$ and the output control circuitry's $V_{ddref}$ line.
Figure 2:
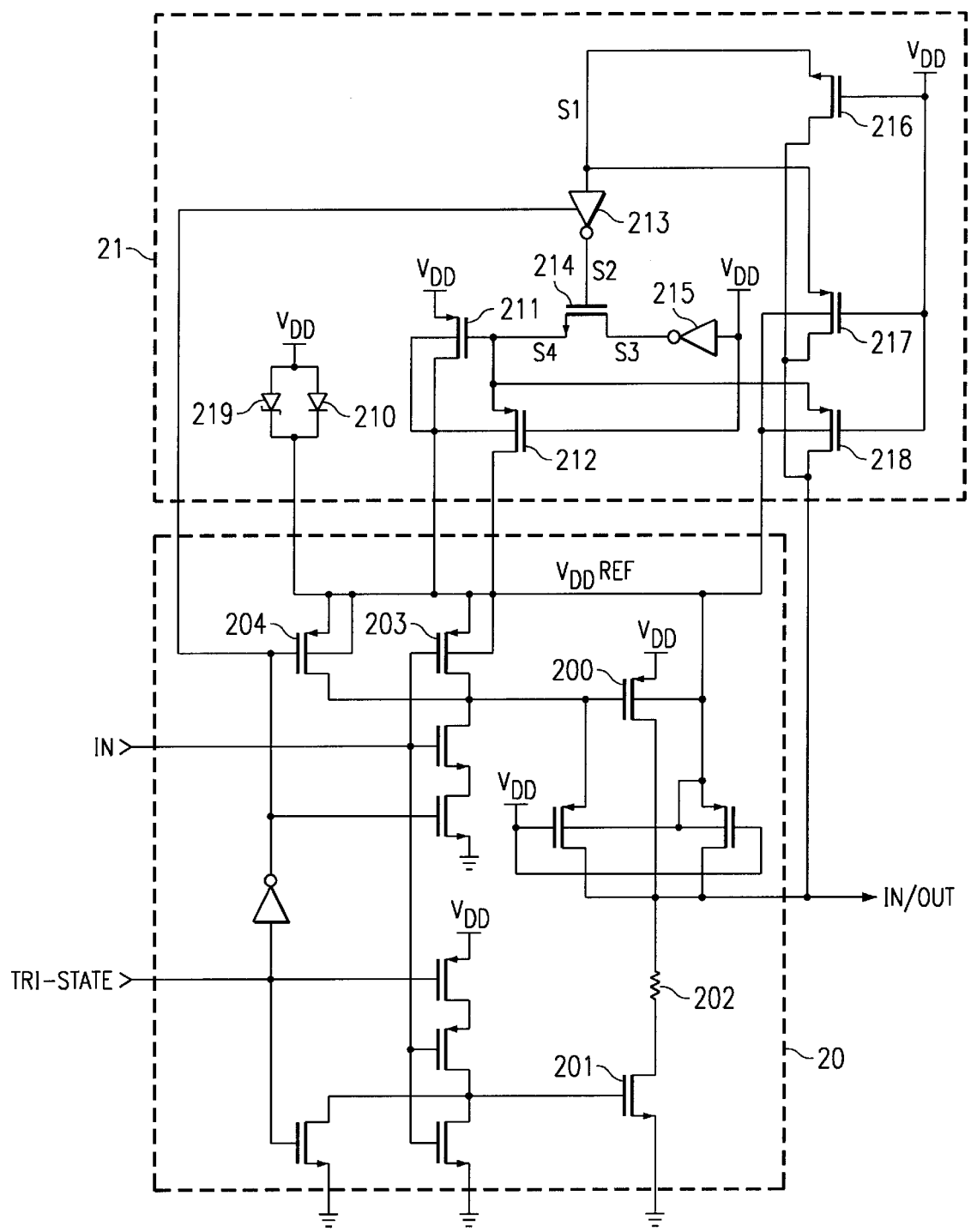
FIG. 2 is a schematic of conventional pre-driver circuit, with back-gate current blocking diode by-pass circuitry that requires eight additional components.
Figure 3:
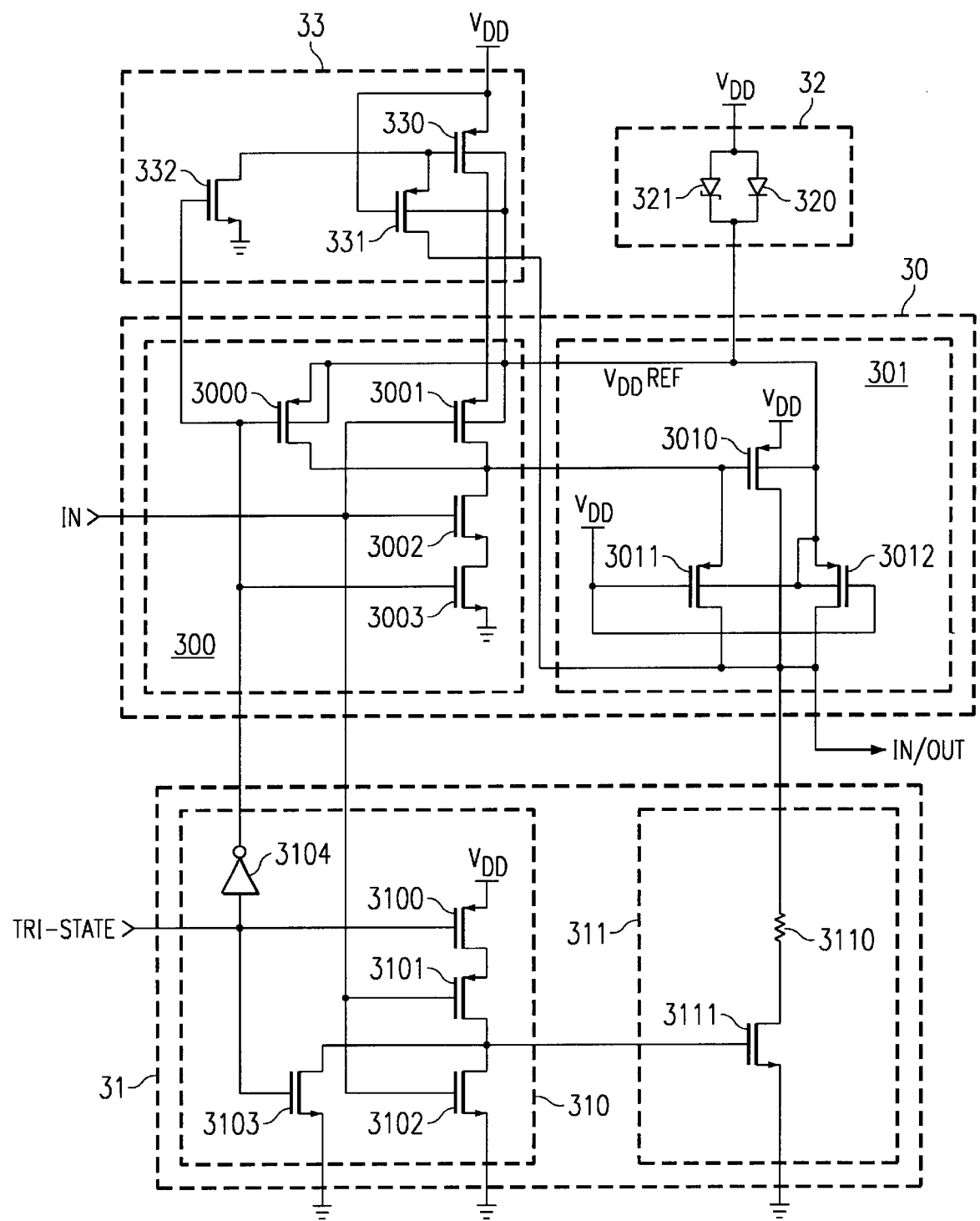
FIG. 3 is a schematic of the unique pre-driver circuit of the present invention, which requires only three additional components and uses the pre-driver's tri-state input signal to control the pull-up path of the pre-driver's upper output device to bypass the back-gate current blocking diodes for improved high frequency operation, lower $I_{off}$ current, and over-voltage tolerant protection in the pre-driver circuit.

FIG. 3 is a schematic for the pre-driver/driver circuit of the present invention. The circuit is comprised of an upper pre-drive/driver stage 30, a lower pre-driver/driver stage 31, the blocking diode combination 32, and the three-component by-pass circuitry 33. The blocking diode combination 32 consists of a pn diode 320 in parallel with a Schottky diode 321. The upper pre-driver/driver stage 30 consists of upper pre-driver control circuitry 300 and an upper output driver circuit 301. Likewise, the lower pre-driver/driver stage 31 consists of lower pre-driver control circuitry 310 and a lower output driver circuit 311.

The cathodes of pn diode 320 and Schottky diode 321 are tied together to provide a $V_{ddref}$ voltage to the upper pre-driver/driver circuit.

The upper pre-driver stage input control circuit 300 further consists of two p-channel transistors 3000 and 3001 with their drains tied together and coupled to the upper pre-driver control circuit's 300 output and to the source of a first of two series n-channel transistors 3002 and 3003, which provides a signal path from the upper pre-driver control circuits output to gnd. The source and back-gate of p-channel transistor 3000 and the back-gate of transistor 3001 are connected to the $V_{ddref}$ line at the cathode of the two diodes 320/321. The source of p-channel transistor 3001 is driven by the drain of p-channel transistor 330 of the by-pass circuit 33. The gates of the first p-channel transistor 3000 and the second n-channel transistor 3003 are connected to the $\overline{\text{Tri-state}}$ input signal and the gates of the second p-channel transistor 3001 and the first n-channel transistor 3002 are connected to the In signal.

The upper driver stage's output driver circuit 301 consists of a p-channel upper output (UOP) driver transistor 3010 coupled between $V_{dd}$ and a load ballast resistor 3110 in the lower driver stage 31 with the driver circuit's input/output (I/O) being taken off the node at the connection of the drain of the UOP transistor 3010 and the ballast resistor 3110. The source of the UOP transistor 3010 is tied to $V_{dd}$. There are two p-channel clamping transistors 3011 and 3012 used in the over-voltage tolerant function of the pre-driver/driver circuit. The gate of the UOP transistor 3010 is coupled to the upper pre-driver control circuit's 300 output and to the source of p-channel clamping transistor 3011. The gates of the two clamping transistors 3011/3012 are coupled together and tied to $V_{dd}$, while the drains of these transistors are both coupled to the upper driver's I/O pin. The source and back-gate of clamping transistor 3012, the back-gate of clamping transistor 3011, and the back-gate of UOP transistor 3010 are tied to the $V_{ddref}$ line.

The lower pre-driver stage input control circuit 310 consists of two p-channel transistor 3100/3101 and two n-channel transistors 3102/3103. The two p-channel transistors 3100/3101 are connected in series with the drain of transistor 3100 connected to the source of transistor 3101 and the source of transistor 3100 tied to $V_{dd}$. The two n-channel transistors 3102/3103 are connected in parallel with their drains connected together and coupled to the drain of p-channel transistor 3101 and the output of this lower pre-driver control circuit 310. The sources of n-channel transistors 3102 and 3103 are tied to gnd. The gates of p-channel transistor 3100 and n-channel transistor 3103 are tied to the Tri-state input signal, while the gates of p-channel transistor 3101 and n-channel transistor 3102 are tied to the In signal. Inverter 3104 is used to provide the $\overline{\text{Tri-state}}$ control signal from the Tri-state input signal.

The lower driver stage's output driver circuit 311 consists of a n-channel lower output (LOP) driver transistor 3111 and a load ballast resistor 3110. The ballast resistor 3110 is coupled between the driver's I/O pin and the drain of n-channel transistor 3111 and the source of transistor 3111 are tied to gnd. The gate of transistor 3111 is coupled to the lower pre-driver control circuit's 310 output.

The three-component back-gate current blocking diode by-pass circuit 33 is included to by-pass the two blocking diodes 320 and 321 during normal operation of the circuit. The by-pass portion of the circuit consists of two p-channel transistors 330/331 and one n-channel transistor 332. The source of p-channel transistor 330 is coupled to the gate of p-channel transistor 331 and tied to $V_{dd}$. The drain of transistor 330 is tied to the source of p-channel transistor 3001 in the upper pre-driver control circuit 300. The gate of transistor 330 is coupled to the source of p-channel transistor 331 and to the drain of n-channel transistor 332. The gate of n-channel transistor 332 is tied to the $\overline{\text{Tri-state}}$ input signal and the source is tied to gnd. Finally the drain of p-channel transistor 331 is coupled to the driver's I/O pin. The back-gates of p-channel transistors 330 and 331 are tied to the $V_{ddref}$ line.

In operation, the three components 330–332 are added to the pre-driver circuit to by-pass the blocking diode combination in the pull-up path of the UOP transistor 3010. During normal operation of the circuit, when the Tri-state signal is LOW and the In signal is LOW, n-channel transistor 332 and p-channel transistors 330 and 3001 are all in an ON condition, pulling the gate of UOP transistor 3010 to $V_{dd}$ and turning the UOP transistor completely OFF, thereby preventing any current from flowing through the device, eliminating any increase in the circuit's $I_{ccd}$ and $C_{pd}$.

During the $I_{off}$ condition, $V_{dd}$ is zero volts and n-channel transistor 332 is in an OFF condition. P-channel transistor 331 is in an ON condition, ready to clamp the I/O voltage to the gate of p-channel transistor 330. Also, P-channel clamping transistor 3011 is in an ON condition, ready to clamp the pre-driver's I/O voltage to the gate of UOP transistor 3010 and p-channel transistor 3012 is in an ON condition, ready to the I/O voltage to the $V_{ddref}$ line. As the I/O output is ramped up to a given high voltage level, p-channel transistor 330 will turn OFF through p-channel transistor 331 and the UOP transistor 3010 will turn OFF through clamping transistors 3011 and 3012.

During an over-voltage tolerant condition, the Tri-state signal is HIGH, turning n-channel transistor 332 to an OFF condition and p-channel transistor 3000 to an ON condition. When the I/O output is ramped to a voltage level, which is $v_t$ above $V_{dd}$, clamping transistors 331, 3011, and 3012 are all turned ON. This in turn clamps the I/O voltage of the pre-driver to the gates of p-channel transistor 330 and the UOP transistor 3010, respectively, thereby protecting the circuit from the over-voltage.

While this invention has been described in the context of a preferred embodiment, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

What is claimed is:

1. A pre-driver/driver circuit to prevent an increase in dynamic operating current and power dissipation capacitance in said circuit, comprising:

an upper pre-driver 30/driver stage and a lower pre-driver 31/driver stage, the output of said upper and lower stages being combined and coupled to an in/out pin and the input of said stages being tied together and coupled to an In signal;

said upper pre-driver 30 stage having a control input coupled to a $\overline{\text{Tri-state}}$ control signal and said lower pre-driver state having a control input coupled to a Tri-state control 3104 signal;

a Schottky and a pn 32 blocking diode connected in parallel and inserted between a $V_{dd}$ power supply and said upper pre-driver/driver stage's back-gate and control circuitry for blocking current flow when said pre-driver stages are in the Tri-state mode; and a back-gate current 33 blocking diode by-pass circuit for by-passing the voltage drop across said blocking diodes to assure that an upper output transistor in said upper pre-driver/driver stage turns OFF during normal operation of said pre-driver circuit, wherein said blocking diode by-pass circuit further comprises:

a n-channel control transistor, the source being coupled to gnd, the gate coupled to said $\overline{\text{Tri-state}}$ signal, and the drain coupled to the gate of a first p-channel transistor and to the source of a second p-channel transistor;

the source of said first p-channel transistor coupled to the gate of said second p-channel transistor and to a power source; and the drain of said first p-channel transistor coupled to a first output of said by-pass circuit and the drain of said second p-channel transistor coupled to a second output of said by-pass circuit and to said pre-driver/driver input/output pin.

2. The pre-driver/driver circuit of claim 1, wherein:

said upper pre-driver/driver stage includes an input control circuit and an output driver circuit; and said lower pre-driver/driver stage includes an input control circuit and an output driver circuit.

3. The pre-driver/driver circuit of claim 2, wherein said input control circuit of said upper pre-driver/driver stage, used to control the gate of an upper output device, further comprises:

first and second n-channel transistors connected in series with the source of said first transistor connected to the drain of said second transistor, the gate of said first transistor being coupled to said In signal, the gate of said second transistor being couple to said $\overline{\text{Tri-state}}$ signal, and the source of said second transistor coupled to gnd; and the source of a first p-channel transistor being coupled to said first output of said pre-driver circuit, the source of said second n-channel transistor being coupled to the negative side of said blocking diodes, and the drains of said first and second p-channel transistors connected together and coupled to the drain of said first n-channel transistor and to the control output of said upper output driver circuit, and the gate of said first p-channel transistor coupled to said In signal and the gate of said second p-channel transistor coupled to said $\overline{\text{Tri-state}}$ signal and the back-gate of first and second p-channel transistors coupled to the negative side of said blocking diodes.

4. The pre-driver/driver circuit of claim 2, wherein said output driver circuit of said upper pre-driver/driver stage further comprises:

an upper output p-channel transistor, the gate being coupled to said output of said upper pre-driver stage output, the source coupled to a power source, and the drain coupled to said input/output pin;

second and third p-channel transistors for clamping the voltage at said output pin to the gate of said upper output transistor, thereby turning OFF said output transistor, the gates of said second and third transistors being coupled to said power source; and the drains of said second and third transistor coupled to said output pin, the source of said second transistor coupled to the output of said upper pre-driver stage input control circuit and to the gate of said upper output transistor, and the source of said third transistor coupled to the negative side of said blocking diodes.

5. The pre-driver/driver circuit of claim 2, wherein said input control circuit of said lower pre-driver/driver stage, further comprises:
   first and second p-channel transistors connected in series with the drain of said first transistor connected to the source of said second transistor, the gate of said first transistor being coupled to said Tri-state input signal and the gate of said second transistor being coupled to said input signal, and the source of said first transistor connected to a said power source; and
   first and second n-channel transistors connected in parallel with sources of said transistors coupled to gnd, and drains of said first and second transistors connected together and coupled to the drain of said second p-channel transistor and to the control output of said lower pre-driver input control circuit, the gate of said second transistor coupled to said In signal, and the gate of said first transistor coupled to said Tri-state input signal.

6. The pre-driver/driver circuit of claim 2, wherein said output driver circuit of said lower pre-driver state, used to supply and sink current to and from said input/output pin, further comprises:
   a n-channel transistor with gate coupled to the said output of said lower pre-driver input control circuit, the source connected to gnd, and the drain of said transistor being coupled to the first side of a ballast resistor, and the second side of said ballast resistor being coupled to said input/output pin.

7. The pre-driver/driver circuit of claim 2, wherein during normal operation of said pre-driver in high frequency switching conditions, the gate of said upper output transistor is pulled up to a rail of said power source, completely turning OFF said upper output transistor, thereby preventing an increase in said circuit's dynamic operating current and power dissipation capacitance.

8. A pre-driver/driver circuit to prevent an increase in dynamic operating current and power dissipation capacitance in said circuit, comprising:
   an upper pre-driver 30/driver stage and a lower pre-driver 31/driver stage, the output of said upper and lower stages being combined and coupled to an in/out pin and the input of said stages being tied together and coupled to an In signal;
   said upper pre-driver 30 stage having a control input coupled to a $\overline{\text{Tri-state}}$ control signal and said lower pre-driver state having a control input coupled to a Tri-state control 3104 signal;
   a Schottky and a pn 32 blocking diode connected in parallel and inserted between a $V_{dd}$ power supply and said upper pre-driver/driver stage's back-gate and control circuitry for blocking current flow when said pre-driver stages are in the Tri-state mode;
   a back-gate current 33 blocking diode by-pass circuit for by-passing the voltage drop across said blocking diodes to assure that an upper output transistor in said upper pre-driver/driver stage turns OFF during normal operation of said pre-driver circuit,
   said upper pre-driver/driver stage includes an input control circuit and an output driver circuit; and
   said lower pre-driver/driver stage includes an input control circuit and an output driver circuit,
   wherein said blocking diode by-pass circuitry requires only 3 components, thereby reducing the power consumption and chip area requirements of the pre-driver circuit.

9. A pre-driver/driver circuit to prevent an increase in dynamic operating current and power dissipation capacitance in said circuit, comprising:
   an upper pre-driver 30/driver stage and a lower pre-driver 31/driver stage, the output of said upper and lower stages being combined and coupled to an in/out pin and the input of said stages being tied together and coupled to an In signal said upper pre-driver/driver stage including first and second p-channel transistors;
   said upper pre-driver 30 stage having a control input coupled to a $\overline{\text{Tri-state}}$ control signal and said lower pre-driver state having a control input coupled to a Tri-state control 3104 signal;
   a Schottky and a pn 32 blocking diode connected in parallel and inserted between a $V_{dd}$ power supply and said upper pre-driver/driver stage's back-gate and control circuitry for blocking current flow when said pre-driver stages are in the Tri-state mode;
   a back-gate current 33 blocking diode by-pass circuit for by-passing the voltage drop across said blocking diodes to assure that an upper output transistor in said upper pre-driver/driver stage turns OFF during normal operation of said pre-driver circuit, said by-pass circuit including first and second p-channel transistors,
   said upper pre-driver/driver stage includes an input control circuit and an output driver circuit; and
   said lower pre-driver/driver stage includes an input control circuit and an output driver circuit,
   wherein during $I_{off}$ condition where said $V_{dd}$ equals zero volts, said by-pass circuit's said second p-channel transistor is in and ON state ready to clamp the gate of said by-pass circuit's said first p-channel transistor, said upper pre-driver/driver stage's said first and second p-channel transistors are in an ON condition, ready to clamp said input/output pin voltage to the gate of said-upper output transistor, so that when said input/output pin voltage is ramped up to a given high voltage, said by-pass circuit's first p-channel transistor will turn OFF through said by-pass circuit's second p-channel transistor and said upper output transistor will turn OFF through said upper pre-driver stage's first and second p-channel clamping transistors.

10. A pre-driver/driver circuit to prevent an increase in dynamic operating current and power dissipation capacitance in said circuit, comprising:
    an upper pre-driver 30/driver stage and a lower pre-driver 31/driver stage, the output of said upper and lower stages being combined and coupled to an in/out pin and the input of said stages being tied together and coupled to an In signal said upper pre-driver/driver stage including first and second p-channel transistors;
    said upper pre-driver 30 stage having a control input coupled to a $\overline{\text{Tri-state}}$ control signal and said lower pre-driver state having a control input coupled to a Tri-state control 3104 signal;
    a Schottky and a pn 32 blocking diode connected in parallel and inserted between a $V_{dd}$ power supply and said upper pre-driver/driver stage's back-gate and control circuitry for blocking current flow when said pre-driver stages are in the Tri-state mode;

a back-gate current 33 blocking diode by-pass circuit for by-passing the voltage drop across said blocking diodes to assure that an upper output transistor in said upper pre-driver/driver stage turns OFF during normal operation of said pre-driver circuit, said by-pass circuit including first and second p-channel transistors, said upper pre-driver/driver stage includes an input control circuit and an output driver circuit; and said lower pre-driver/driver stage includes an input control circuit and an output driver circuit, wherein during an over-voltage condition with said Tri-state signal being in the ON state and both said p-channel transistor of said by-pass circuit is in the OFF state and said second p-channel transistor in said upper pre-driver control circuit is in the ON state, and when said input/output pin is ramped to a voltage $v_t$ above said power source, a first p-channel clamping transistor in said by-pass circuit stage and first and second p-channel clamping transistors of said upper output stage turn ON, thereby clamping said input/output pin voltage to the gates of said by-pass circuit's p-channel transistor and said pre-driver's upper output transistor, respectively.

\* \* \* \* \*